(12) United States Patent
    Stime

(10) Patent No.: US 10,638,627 B1
(45) Date of Patent: Apr. 28, 2020

(54) POLYGONALLY-SHAPED FINGER GRIP FOR A PORTABLE ELECTRONIC DEVICE

(71) Applicant: Philip Stime, Sammamish, WA (US)

(72) Inventor: Philip Stime, Sammamish, WA (US)

( * ) Notice: Subject to any disclaimer, the term of this patent is extended or adjusted under 35 U.S.C. 154(b) by 0 days.

(21) Appl. No.: 16/267,524

(22) Filed: Feb. 5, 2019

(51) Int. Cl.
    *H05K 5/02* (2006.01)
    *F16M 13/00* (2006.01)
    *G06F 1/16* (2006.01)
    *F16M 11/10* (2006.01)

(52) U.S. Cl.
    CPC ........... *H05K 5/023* (2013.01); *F16M 11/105* (2013.01); *F16M 13/005* (2013.01); *G06F 1/166* (2013.01); *G06F 1/1628* (2013.01); *F16M 2200/08* (2013.01)

(58) Field of Classification Search
    CPC .... H05K 5/023; F16M 11/105; F16M 13/005; G06F 1/166; G06F 1/1628
    See application file for complete search history.

(56) References Cited

U.S. PATENT DOCUMENTS

| | | | |
|---|---|---|---|
| 8,186,642 B2 | 5/2012 | Weiss-Vons | |
| 8,560,031 B2 | 10/2013 | Barnett | |
| 8,676,279 B2 * | 3/2014 | McCurdy | A45F 5/00 455/575.6 |
| 8,737,066 B1 | 5/2014 | Block | |
| 8,844,098 B2 | 9/2014 | Karmatz | |
| 9,074,725 B2 | 7/2015 | Trotsky | |
| D794,607 S | 8/2017 | Srour | |
| 9,787,348 B2 | 10/2017 | Srour | |
| 9,800,703 B2 | 10/2017 | Roux | |
| 9,958,107 B1 | 5/2018 | Hobbs | |
| 10,244,854 B1 * | 4/2019 | Haber | A45F 5/10 |
| 10,355,734 B1 * | 7/2019 | Otmani | G06F 1/1626 |
| 10,389,860 B2 * | 8/2019 | Nahum | H04M 1/04 |
| 2010/0155550 A1 * | 6/2010 | Weiss-Vons | B65H 75/143 248/206.3 |
| 2015/0084356 A1 | 3/2015 | Dinh | |
| 2016/0069512 A1 * | 3/2016 | Grieve | A45F 5/10 294/142 |
| 2017/0195000 A1 * | 7/2017 | Srour | H04B 1/3888 |
| 2019/0089822 A1 * | 3/2019 | Gartz | F16M 11/105 |

FOREIGN PATENT DOCUMENTS

WO      2012125690      9/2012

* cited by examiner

*Primary Examiner* — Nidhi Thaker
(74) *Attorney, Agent, or Firm* — Kyle A. Fletcher, Esq.

(57) ABSTRACT

The polygonally-shaped finger grip for a portable electronic device is a mechanical structure. The polygonally-shaped finger grip for a portable electronic device is configured for use with a personal data device. The polygonally-shaped finger grip for a portable electronic device is adapted to attach to a finger of a client. The polygonally-shaped finger grip for a portable electronic device attaches the personal data device to the finger of the client such that the client does not have to grasp the personal data device. The polygonally-shaped finger grip for a portable electronic device is a rotating structure. The rotating structure allows a client to change the orientation of the personal data device between a landscape orientation and a portrait orientation while wearing the polygonally-shaped finger grip for a portable electronic device. The polygonally-shaped finger grip for a portable electronic device comprises a PDD grip and the personal data device.

16 Claims, 7 Drawing Sheets

POLYGONALLY-SHAPED FINGER GRIP FOR A PORTABLE ELECTRONIC DEVICE

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of personal and domestic articles including traveling equipment, more specifically, a holder for a handheld object. (A45F5/00)

SUMMARY OF INVENTION

The polygonally-shaped finger grip for a portable electronic device is a mechanical structure. The polygonally-shaped finger grip for a portable electronic device is configured for use with a personal data device. The polygonally-shaped finger grip for a portable electronic device is adapted to attach to a finger of a client. The polygonally-shaped finger grip for a portable electronic device attaches the personal data device to the finger of the client such that the client does not have to grasp the personal data device. The polygonally-shaped finger grip for a portable electronic device is a rotating structure. The rotating structure allows a client to change the orientation of the personal data device between a landscape orientation and a portrait orientation while wearing the polygonally-shaped finger grip for a portable electronic device. The polygonally-shaped finger grip for a portable electronic device comprises a PDD grip and the personal data device.

These together with additional objects, features and advantages of the polygonally-shaped finger grip for a portable electronic device will be readily apparent to those of ordinary skill in the art upon reading the following detailed description of the presently preferred, but nonetheless illustrative, embodiments when taken in conjunction with the accompanying drawings.

In this respect, before explaining the current embodiments of the polygonally-shaped finger grip for a portable electronic device in detail, it is to be understood that the polygonally-shaped finger grip for a portable electronic device is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the polygonally-shaped finger grip for a portable electronic device.

It is therefore important that the claims be regarded as including such equivalent construction insofar as they do not depart from the spirit and scope of the polygonally-shaped finger grip for a portable electronic device. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
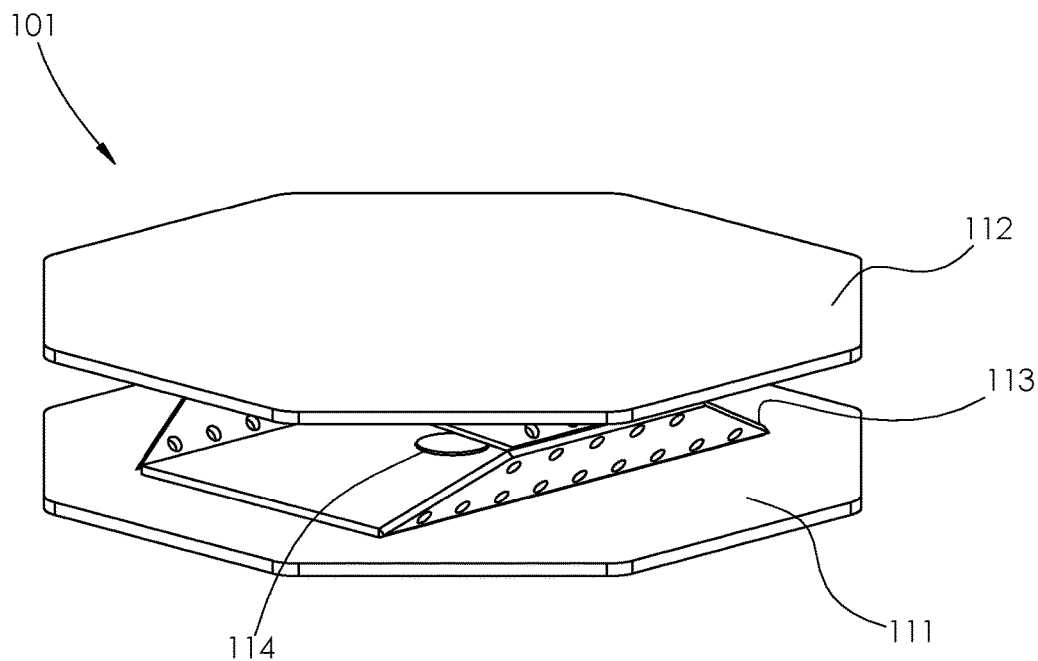
FIG. 1 is a perspective view of an embodiment of the disclosure.
Figure 2:
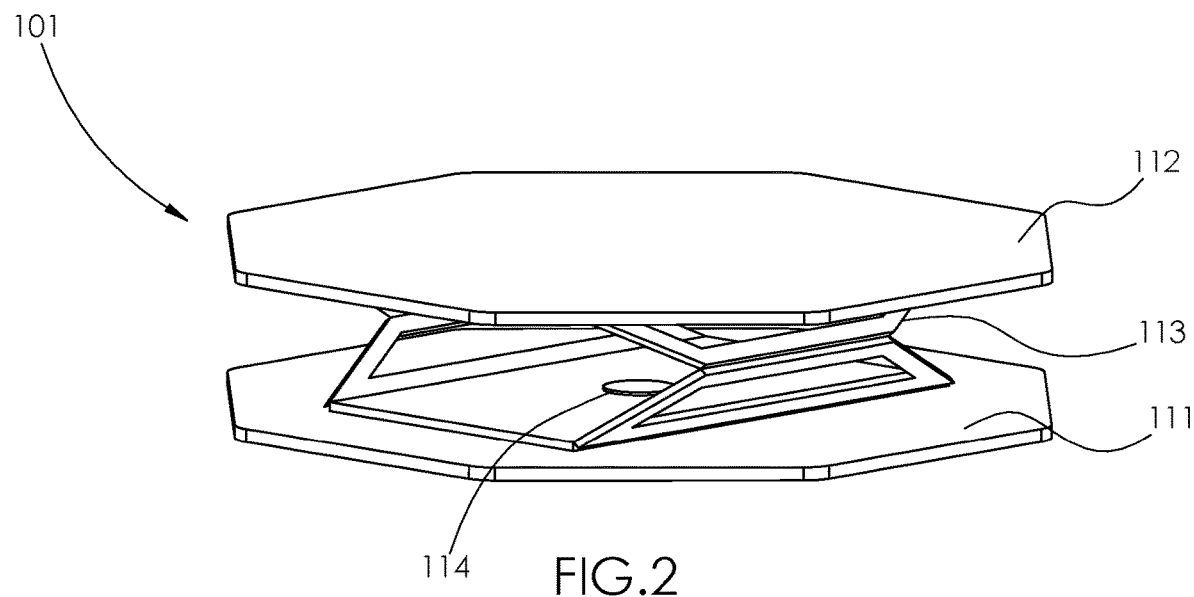
FIG. 2 is a perspective view of an alternate embodiment of the disclosure.
Figure 3:
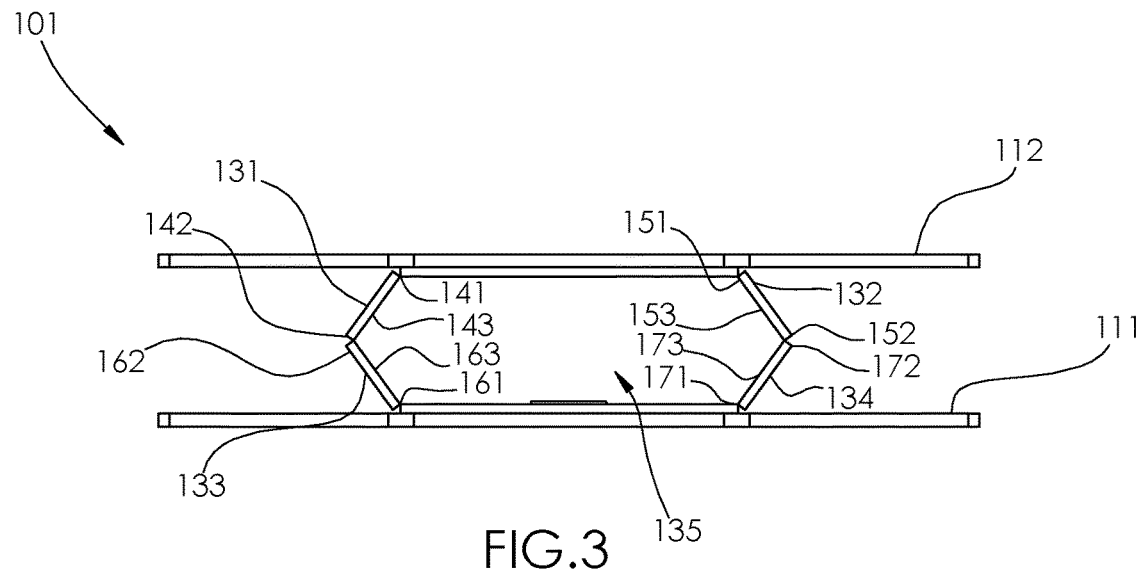
FIG. 3 is a side view of an embodiment of the disclosure.
Figure 4:
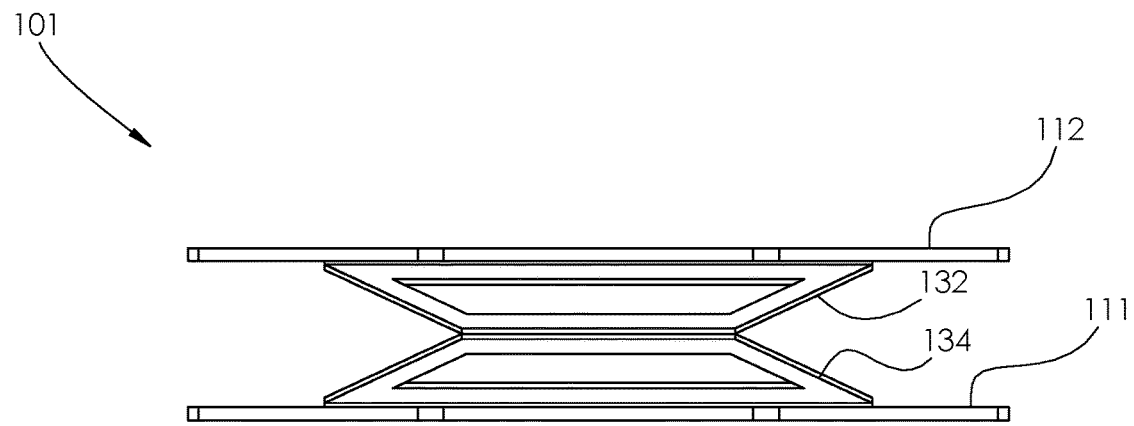
FIG. 4 is a side view of an alternate embodiment of the disclosure.
Figure 5:
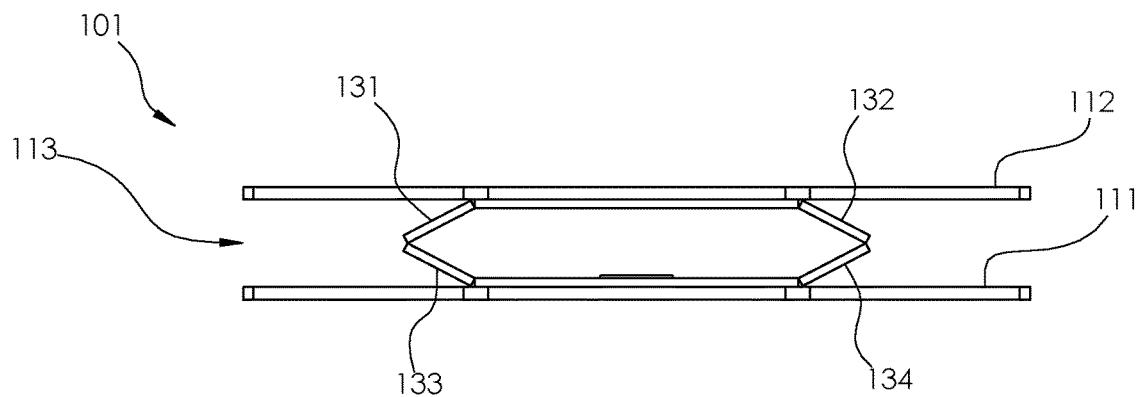
FIG. 5 is a compressed side view of an embodiment of the disclosure.
Figure 6:
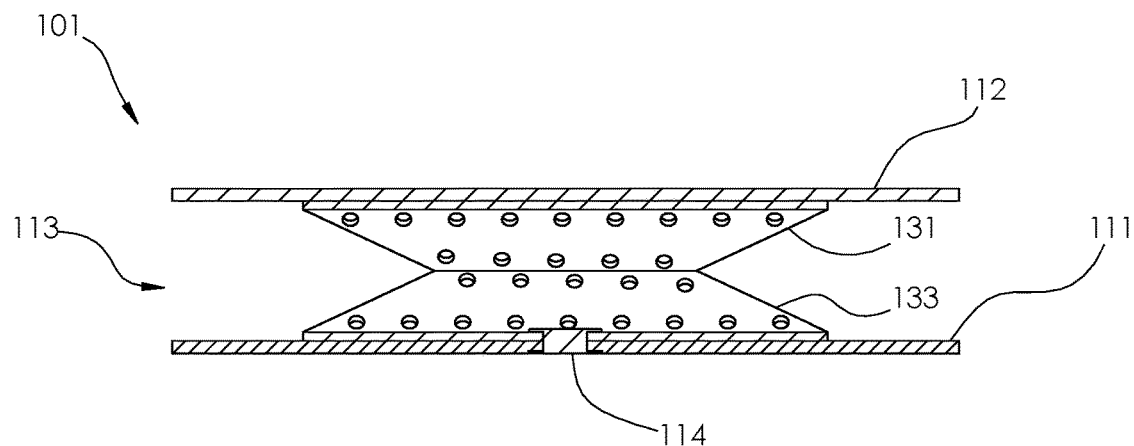
FIG. 6 is a rotated side view of an embodiment of the disclosure.
Figure 7:
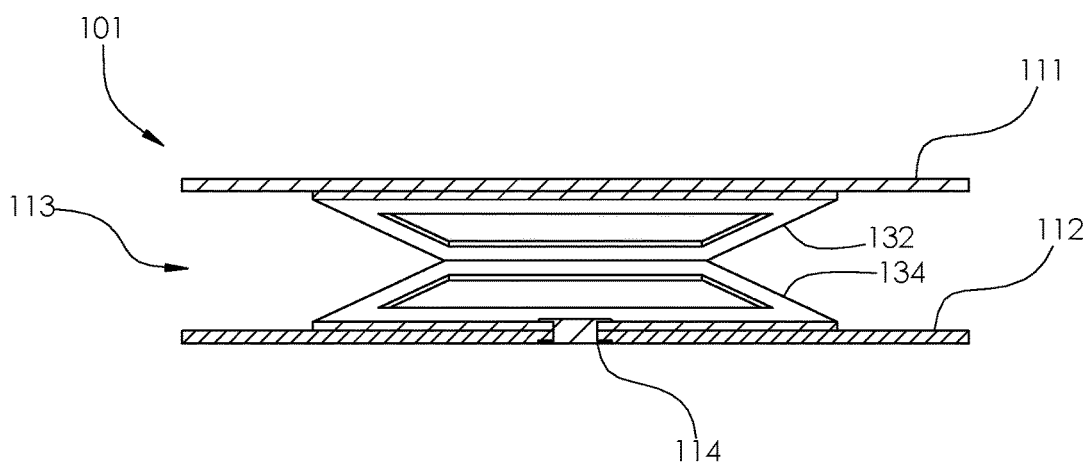
FIG. 7 is a rotated side view of an alternate embodiment of the disclosure.
Figure 8:
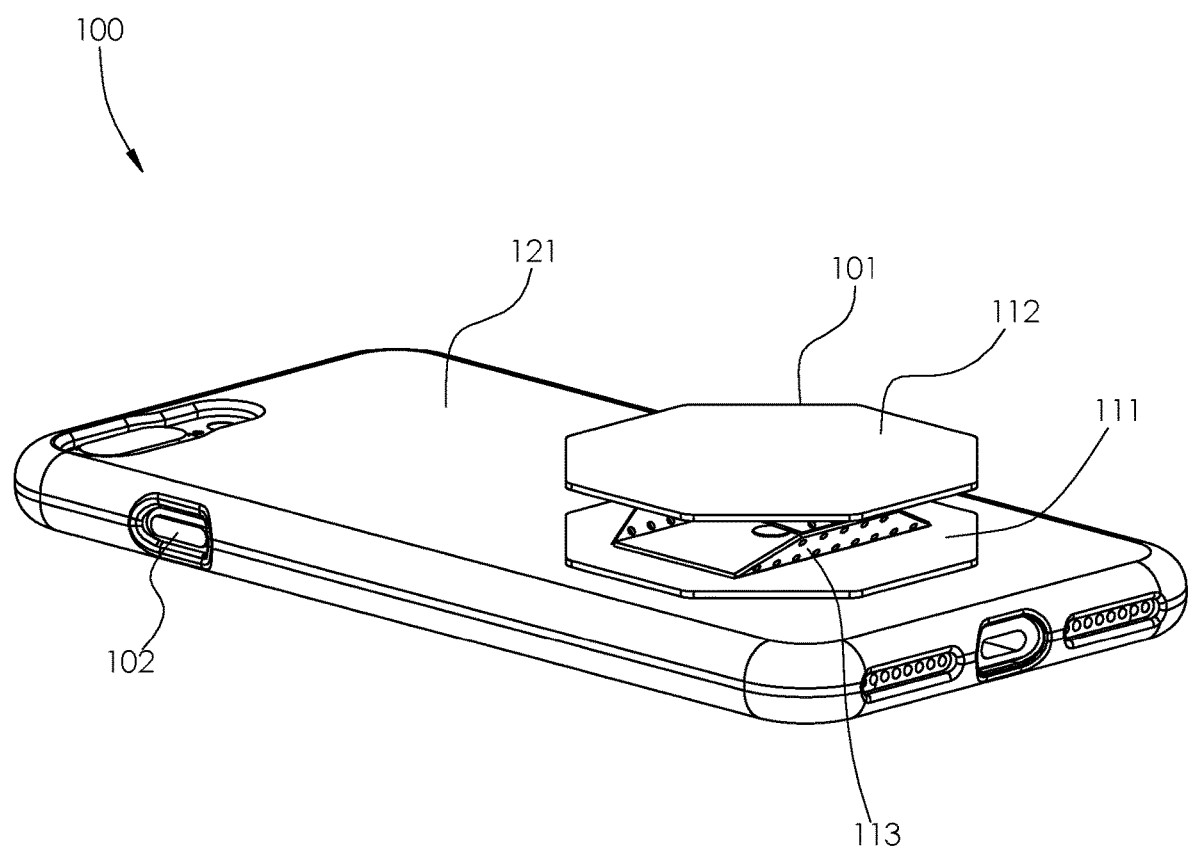
FIG. 8 is an in-use view of an embodiment of the disclosure.
Figure 9:
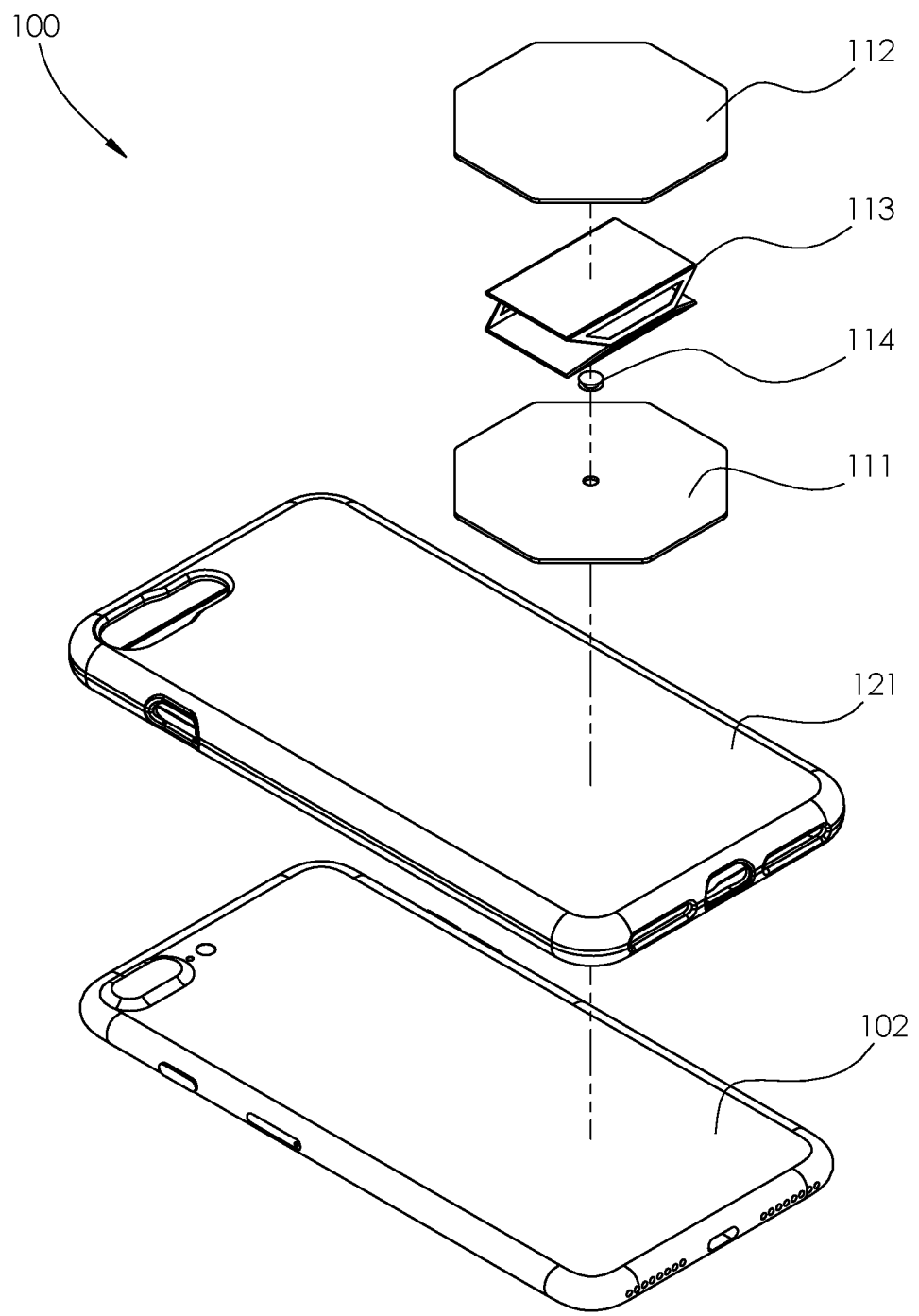
FIG. 9 is an exploded view of an embodiment of the disclosure.
Figure 10:
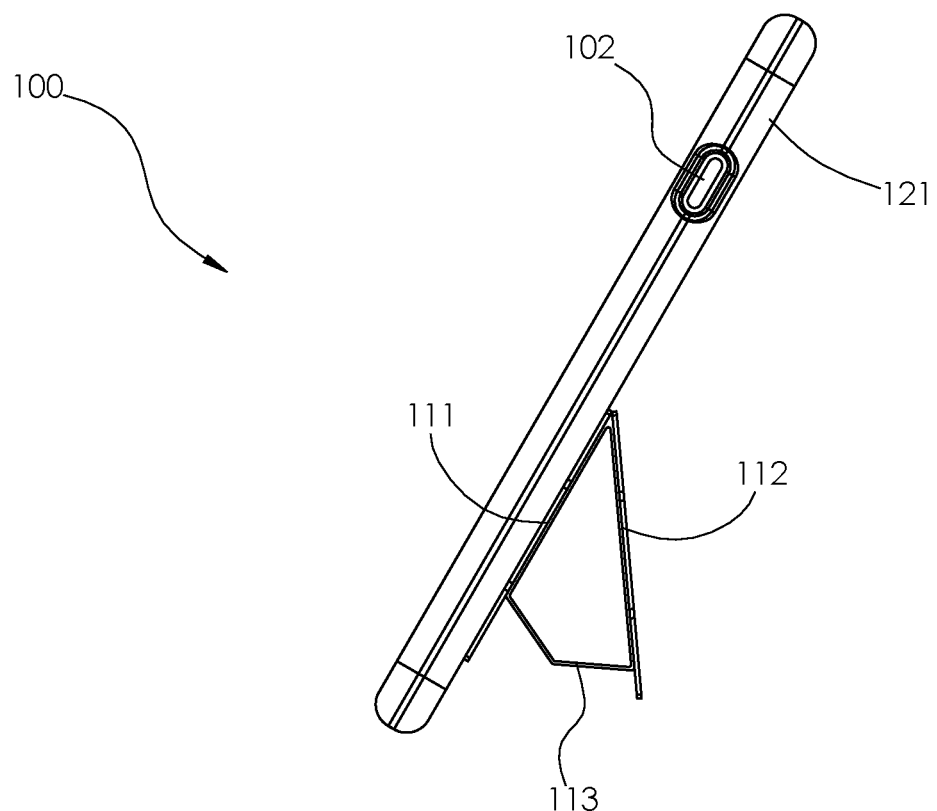
FIG. 10 is an in-use view of an embodiment of the disclosure.
Figure 11:
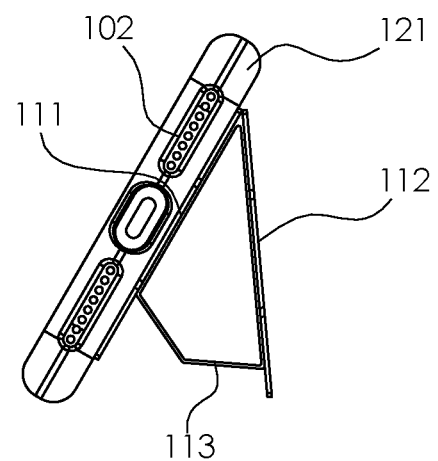
FIG. 11 is an in-use view of an embodiment of the disclosure.
Figure 12:
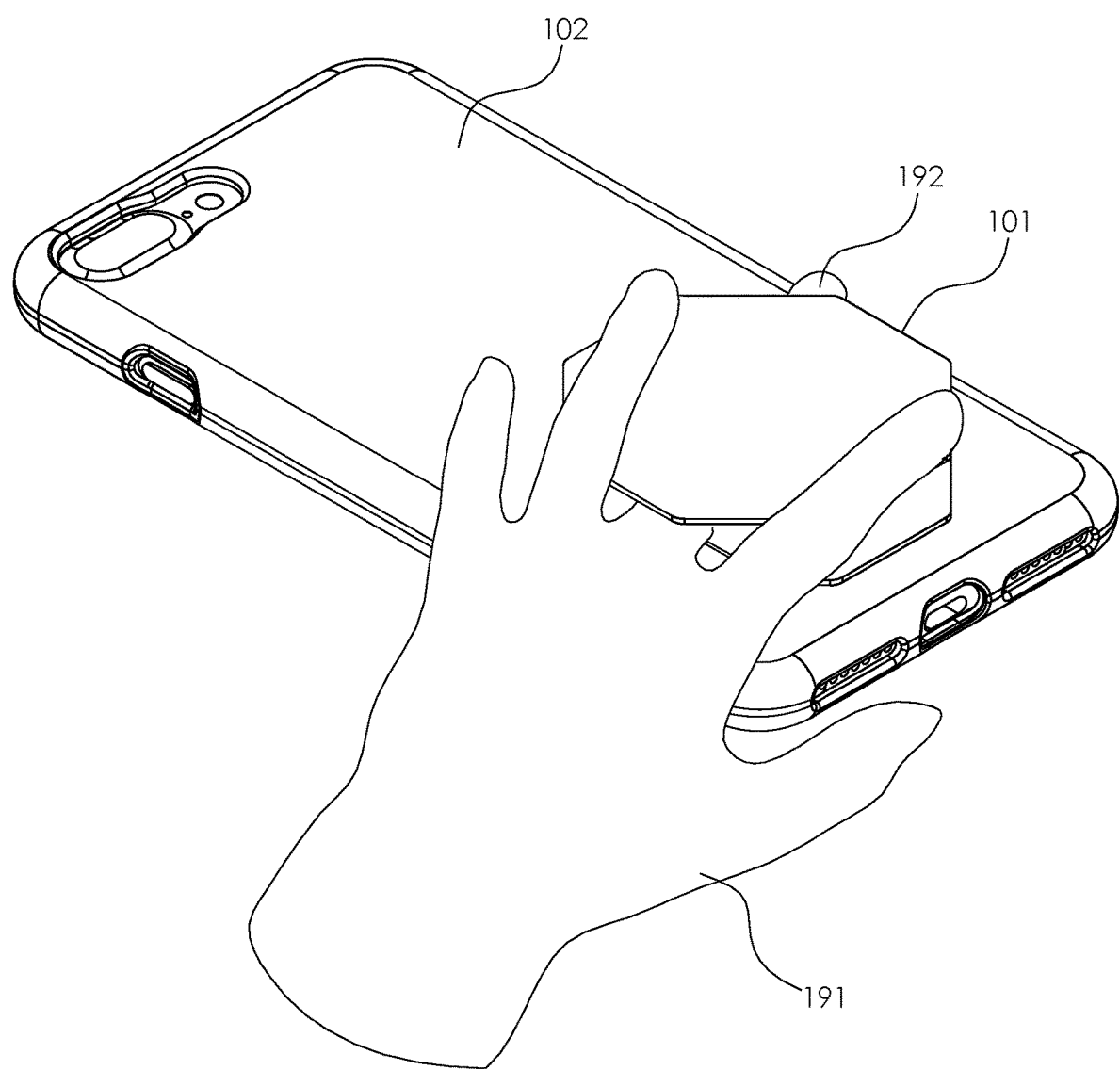
FIG. 12 is an in-use view of an embodiment of the disclosure.

Detailed reference will now be made to one or more potential embodiments of the disclosure, which are illustrated in FIGS. 1 through 12.

The polygonally-shaped finger grip for a portable electronic device 100 (hereinafter invention) is a mechanical structure. The invention 100 is configured for use with a personal data device 102. The invention 100 is adapted to attach to a finger 192 of a client 191. The invention 100 attaches the personal data device 102 to the finger 192 of the client 191 such that the client 191 does not have to grasp the personal data device 102. The invention 100 is a rotating structure. The rotating structure allows a client 191 to change the orientation of the personal data device 102 between a landscape orientation and a portrait orientation while wearing the invention 100. The invention 100 comprises a PDD grip 101 and the personal data device 102.

The personal data device 102 is a programmable electrical device that provides data management and communication services through one or more functions referred to as an application. The application is a set of logical operating instructions that are performed by the personal data device 102. The addition of an application will provide increased functionality for the personal data device 102. Methods to design and implement an application on a personal data device 102 are well known and documented in the electrical arts.

The personal data device 102 further comprises a PDD shell 121. The PDD shell 121 is a commercially available container. The PDD shell 121 forms a protective casing used to contain the personal data device 102. The PDD shell 121 is a commercially available casing. The PDD shell 121 contains the personal data device 102. The PDD shell 121 is formed with all apertures and form factors necessary to allow the PDD shell 121 to accommodate the use and operation of the personal data device 102. Methods to form a PDD shell 121 suitable for the purposes described in this disclosure are well-known and documented in the mechanical arts.

The PDD grip 101 is the mechanical structure that attaches to the PDD shell 121 of the personal data device 102. The PDD grip 101 is an elastic structure that attaches the personal data device 102 to a finger 192 of the client 191 such that the client 191 can manipulate the personal data device 102 without having to grasp the personal data device 102. The PDD grip 101 comprises a proximal disk 111, a distal disk 112, a coupling structure 113, and a pivot 114. The proximal disk 111 is further defined with an interior face 181 and an exterior face 182. The interior face 181 is the face of the proximal disk 111 that attaches to the PDD shell 121 of the personal data device 102. The exterior face 182 is the face of the proximal disk 111 that is distal from the interior face 181.

The proximal disk 111 is a disk-shaped structure. The proximal disk 111 attaches the PDD grip 101 to the PDD shell 121 of the personal data device 102. The proximal disk 111 attaches the coupling structure 113 to the PDD shell 121 of the personal data device 102. The proximal disk 111 transfers the load of the personal data device 102 and the PDD shell 121 directly to the coupling structure 113. In the first potential embodiment of the disclosure, the proximal disk 111 is an octagonal-shaped disk structure.

The distal disk 112 is a disk-shaped structure. The distal disk 112 is geometrically identical to the proximal disk 111. The coupling structure 113 attaches to the distal disk 112 such that the distal disk 112 is diametrically opposed to the proximal disk 111. In the first potential embodiment of the disclosure, the distal disk 112 is an octagonal-shaped disk structure.

The coupling structure 113 is a mechanical structure. The coupling structure 113 is an elastic structure. The coupling structure 113 is formed as a composite prism structure. The coupling structure 113 attaches the proximal disk 111 to the distal disk 112. The coupling structure 113 receives the finger 192 of the client 191.

The coupling structure 113 comprises a first segment 131, a second segment 132, a third segment 133, and a fourth segment 134.

The coupling structure 113 acts as a spring. Specifically, when finger 192 of the client 191 inserts into the coupling structure 113 a radial force is applied to the lateral faces of the first segment 131, the second segment 132, the third segment 133, and the fourth segment 134 in a direction perpendicular to the center axis of the coupling structure 113. The applied radial force elongates the span of the diameter of the coupling structure 113 in the direction perpendicular to the center axis of the coupling structure 113. The elasticity of the lateral faces of the first segment 131, the second segment 132, the third segment 133, and the fourth segment 134 creates a force that opposes the displacement created by the applied force. The elasticity of the lateral faces of the first segment 131, the second segment 132, the third segment 133, and the fourth segment 134 returns the coupling structure 113 to its relaxed shape. The finger 192 of the client 191 will prevent the lateral faces of the first segment 131, the second segment 132, the third segment 133, and the fourth segment 134 from returning to their relaxed shape. In this circumstance, the lateral faces of the first segment 131, the second segment 132, the third segment 133, and the fourth segment 134 will apply a force projecting radially towards the center axis of the sock 101 that binds the coupling structure 113 to the finger 192 of the client 191.

The first segment 131 is a mechanical structure. The first segment 131 is an elastic structure. The first segment 131 is formed in the shape of a first hypothetical truncated pyramid. The first hypothetical truncated pyramid is further defined with a first open truncated apex, a first open base, and a first lateral face. The first segment 131 deforms under tension. The first segment 131 comprises a first apex 141, a first base 142, and a first lateral face 143.

The first apex 141 is the edge of the first lateral face 143 that attaches to the distal disk 112. The first apex 141 is the edge formed by the first open truncated apex of the first hypothetical truncated pyramid. The first base 142 is the edge of the first lateral face 143 that attaches to the third base 162 of the third lateral face 163 of the second hypothetical truncated pyramid. The first base 142 is the edge formed by the first open base of the first hypothetical truncated pyramid.

The first lateral face 143 is a rectilinear structure. The first lateral face 143 is an elastic structure. The first lateral face 143 deforms under tension. The first lateral face 143 is the element of the first segment 131 that deforms when the finger 192 of the client 191 inserts into the finger 192 channel 135.

The second segment 132 is a mechanical structure. The second segment 132 is an elastic structure. The second segment 132 is formed in the shape of a second hypothetical truncated pyramid. The second segment 132 deforms under tension. The second segment 132 is identical to the first segment 131. The center axes of the first segment 131 and the second segment 132 are aligned with the center axis of the first hypothetical truncated pyramid. The second segment 132 comprises a second apex 151, a second base 152, and a second lateral face 153.

The second apex 151 is the edge of the second lateral face 153 that attaches to the distal disk 112. The second apex 151 is the edge formed by the first open truncated apex of the first hypothetical truncated pyramid. The second base 152 is the edge of the second lateral face 153 that attaches to the fourth base 172 of the fourth lateral face 173 of the second hypothetical truncated pyramid. The second base 152 is the edge formed by the first open base of the first hypothetical truncated pyramid.

The second lateral face 153 is a rectilinear structure. The second lateral face 153 is an elastic structure. The second lateral face 153 deforms under tension. The second lateral face 153 is the element of the second segment 132 that deforms when the finger 192 of the client 191 inserts into the finger 192 channel 135.

The third segment 133 is a mechanical structure. The third segment 133 is an elastic structure. The third segment 133 is formed in the shape of a third hypothetical truncated pyramid. The second hypothetical truncated pyramid is further defined with a second open truncated apex, a second open base, and a second lateral face. The third segment 133 deforms under tension. The third segment 133 comprises a third apex 161, a third base 162, and a third lateral face 163.

The third apex 161 is the edge of the third lateral face 163 that attaches to the exterior face 182 of the proximal disk 111. The third apex 161 is the edge formed by the second open truncated apex of the second hypothetical truncated pyramid. The third base 162 is the edge of the third lateral face 163 that attaches to the first base 142 of the first lateral face 143 of the first hypothetical truncated pyramid. The third base 162 is the edge formed by the second open base of the second hypothetical truncated pyramid.

The third lateral face 163 is a rectilinear structure. The third lateral face 163 is an elastic structure. The third lateral face 163 deforms under tension. The third lateral face 163 is the element of the third segment 133 that deforms when the finger 192 of the client 191 inserts into the finger 192 channel 135.

The fourth segment 134 is a mechanical structure. The fourth segment 134 is an elastic structure. The fourth segment 134 is formed in the shape of a fourth hypothetical truncated pyramid. The fourth segment 134 deforms under tension. The fourth segment 134 is identical to the third segment 133. The center axes of the third segment 133 and the fourth segment 134 are aligned with the center axis of the second hypothetical truncated pyramid. The fourth segment 134 comprises a fourth apex 171, a fourth base 172, and a fourth lateral face 173.

The fourth apex 171 is the edge of the fourth lateral face 173 that attaches to the exterior face 182 of the proximal disk 111. The fourth apex 171 is the edge formed by the second open truncated apex of the second hypothetical truncated pyramid. The fourth base 172 is the edge of the fourth lateral face 173 that attaches to the second base 152 of the second lateral face 153 of the first hypothetical truncated pyramid. The fourth base 172 is the edge formed by the second open base of the second hypothetical truncated pyramid.

The fourth lateral face 173 is a rectilinear structure. The fourth lateral face 173 is an elastic structure. The fourth lateral face 173 deforms under tension. The fourth lateral face 173 is the element of the fourth segment 134 that deforms when the finger 192 of the client 191 inserts into the finger 192 channel 135.

The first hypothetical truncated pyramid and the second hypothetical truncated pyramid are identical. The first open truncated apex of the first hypothetical truncated pyramid structure attaches to the distal disk 112 such that the center axis of the first hypothetical truncated pyramid structure aligns with the center axis of the distal disk 112. The second open truncated apex of the second hypothetical truncated pyramid structure attaches to the proximal disk 111 of the exterior face 182 such that the center axis of the first hypothetical truncated pyramid structure aligns with the center axis of the proximal disk 111. The alignment of the proximal disk 111, the distal disk 112, the coupling structure 113, and the pivot 114 are such that the PDD grip 101 forms a composite prism structure.

The first segment 131, the second segment 132, the third segment 133 and the fourth segment 134 combine to form the coupling structure 113. The first segment 131, the second segment 132, the, third segment 133 and the fourth segment 134 are assembled such that the first open base of the first hypothetical truncated pyramid attaches to the second open base of the second hypothetical truncated pyramid to form the composite prism structure of the coupling structure 113.

The first segment 131, the second segment 132, the third segment 133 and the fourth segment 134 are aligned such that a finger 192 channel 135 is formed in the coupling structure 113. The finger 192 channel 135 is a radial opening formed through the center axis of the composite prism structure of the coupling structure 113. The finger 192 channel 135 is sized such that when the finger 192 of the client 191 inserts into the finger 192 channel 135, the coupling structure 113 deforms as described elsewhere in this disclosure.

The pivot 114 is a shaft that attaches the proximal disk 111 to the PDD shell 121 of the personal data device 102. The pivot 114 attaches the proximal disk 111 to the PDD shell 121 such that the PDD grip 101 rotates relative to the PDD shell 121. This rotation around the pivot 114 allows the client 191 to rotate the personal data device 102 between a landscape and portrait orientation.

The following definitions were used in this disclosure:

Adhesive: As used in this disclosure, an adhesive is a chemical substance that can be used to adhere two or more objects to each other. Types of adhesives include, but are not limited to, epoxies, polyurethanes, polyimides, or cyanoacrylates, silicone, or latex based adhesives.

Align: As used in this disclosure, align refers to an arrangement of objects that are: 1) arranged in a straight plane or line; 2) arranged to give a directional sense of a plurality of parallel planes or lines; or, 3) a first line or curve is congruent to and overlaid on a second line or curve.

Apex: As used in this disclosure, an apex is a vertex that forms an extreme or solitary point of an object.

Bifurcate: As used in this disclosure, to bifurcate means to divide an object or space into two pieces or segments.

Center: As used in this disclosure, a center is a point that is: 1) the point within a circle that is equidistant from all the points of the circumference; 2) the point within a regular polygon that is equidistant from all the vertices of the regular polygon; 3) the point on a line that is equidistant from the ends of the line; 4) the point, pivot, or axis around which something revolves; or, 5) the centroid or first moment of an area or structure. In cases where the appropriate definition or definitions are not obvious, the fifth option should be used in interpreting the specification.

Center Axis: As used in this disclosure, the center axis is the axis of a cylinder or a prism. The center axis of a prism is the line that joins the center point of the first congruent face of the prism to the center point of the second corresponding congruent face of the prism. The center axis of a pyramid refers to a line formed through the apex of the pyramid that is perpendicular to the base of the pyramid. When the center axes of two cylinder, prism or pyramidal structures share the same line they are said to be aligned. When the center axes of two cylinder, prism or pyramidal structures do not share the same line they are said to be offset.

Client: As used in this disclosure, a client is an individual who is designated to receive the services of the disclosure at bar.

Composite Prism: As used in this disclosure, a composite prism refers to a structure that is formed from a plurality of structures selected from the group consisting of a prism structure and a pyramid structure. The plurality of selected structures may or may not be truncated. The plurality of prism structures are joined together such that the center axes of each of the plurality of structures are aligned. The congruent ends of any two structures selected from the group consisting of a prism structure and a pyramid structure need not be geometrically similar.

Compress: In this disclosure, compress means to force into a smaller space.

Congruent: As used in this disclosure, congruent is a term that compares a first object to a second object. Specifically, two objects are said to be congruent when: 1) they are geometrically similar; and, 2) the first object can superimpose over the second object such that the first object aligns, within manufacturing tolerances, with the second object.

Correspond: As used in this disclosure, the term correspond is used as a comparison between two or more objects wherein one or more properties shared by the two or more objects match, agree, or align within acceptable manufacturing tolerances.

Diameter: As used in this disclosure, a diameter of an object is a straight line segment (or a radial line) that passes through the center (or center axis) of an object. The line segment of the diameter is terminated at the perimeter or boundary of the object through which the line segment of the diameter runs. A radius refers to the line segment that overlays a diameter with one termination at the center of the object. A span of a radius is always one half the span of the diameter. Include Radial Diametrically Opposed: As used in this disclosure, diametrically opposed is a term that describes the locations of a first object and a second object located at opposite ends of a diameter drawn through a third object. The term diametric opposition can also be used to describe this relationship.

Disk: As used in this disclosure, a disk is a prism-shaped object that is flat in appearance. The disk is formed from two congruent ends that are attached by a lateral face. The sum of the surface areas of two congruent ends of the prism-shaped object that forms the disk is greater than the surface area of the lateral face of the prism-shaped object that forms the disk. In this disclosure, the congruent ends of the prism-shaped structure that forms the disk are referred to as the faces of the disk.

Distal: As used in this disclosure, the term distal is used to describe the relative location of two objects. The distal object is the object that is further from a specified reference point.

Elastic: As used in this disclosure, an elastic is a material or object that deforms when a force is applied to it and that is able to return to its relaxed shape after the force is removed. A material that exhibits these qualities is also referred to as an elastomeric material. A material that does not exhibit these qualities is referred to as inelastic or an inelastic material.

Form Factor: As used in this disclosure, the term form factor refers to the size and shape of an object.

Frustum: As used in this disclosure, a frustum is a portion of a solid that lies between two parallel planes that intersect with the solid.

Furcate: As used in this disclosure, to furcate or furcation refers to the division of an object into a plurality branches, pieces or segments.

Geometrically Similar: As used in this disclosure, geometrically similar is a term that compares a first object to a second object wherein: 1) the sides of the first object have a one to one correspondence to the sides of the second object; 2) wherein the ratio of the length of each pair of corresponding sides are equal; 3) the angles formed by the first object have a one to one correspondence to the angles of the second object; and, 4) wherein the corresponding angles are equal. The term geometrically identical refers to a situation where the ratio of the length of each pair of corresponding sides equals 1.

Grip: As used in this disclosure, a grip is an accommodation formed on or within an object that allows the object to be grasped or manipulated by a hand.

Handheld: As used in this disclosure, when referring to an item or device, handheld means that the item or device is small and light enough to be operated while a person holds the item or device in their hands.

Handle: As used in this disclosure, a handle is an object by which a tool, object, or door is held or manipulated with the hand.

N-gon: As used in this disclosure, an N-gon is a regular polygon with N sides wherein N is a positive integer number greater than 2.

One to One: When used in this disclosure, a one to one relationship means that a first element selected from a first set is in some manner connected to only one element of a second set. A one to one correspondence means that the one to one relationship exists both from the first set to the second set and from the second set to the first set. A one to one fashion means that the one to one relationship exists in only one direction.

Orientation: As used in this disclosure, orientation refers to the positioning of a first object relative to: 1) a second object; or, 2) a fixed position, location, or direction.

PDD: As used in this disclosure, PDD is an acronym for personal data device.

Pedestal: As used in this disclosure, a pedestal is an intermediary load bearing structure that that transfers a load path between a supporting surface and an object, structure, or load.

Personal Data Device: As used in this disclosure, a personal data device is a handheld logical device that is used for managing personal information and communication. Examples of personal data device include, but are not limited to, cellular phones, tablets, and smartphones.

Pivot: As used in this disclosure, a pivot is a rod or shaft around which an object rotates or swings.

Prism: As used in this disclosure, a prism is a three-dimensional geometric structure wherein: 1) the form factor of two faces of the prism are congruent; and, 2) the two congruent faces are parallel to each other. The two congruent faces are also commonly referred to as the ends of the prism. The surfaces that connect the two congruent faces are called the lateral faces. In this disclosure, when further description is required a prism will be named for the geometric or descriptive name of the form factor of the two congruent faces. If the form factor of the two corresponding faces has no clearly established or well-known geometric or descriptive name, the term irregular prism will be used. The center axis of a prism is defined as a line that joins the center point of the first congruent face of the prism to the center point of the second corresponding congruent face of the prism. The center axis of a prism is otherwise analogous to the center axis of a cylinder. A prism wherein the ends are circles is commonly referred to as a cylinder.

Proximal: As used in this disclosure, the term proximal is used to describe the relative location of two objects. The proximal object is the object that is closer to a specified reference point.

Pyramid: As used in this disclosure, a pyramid is a three-dimensional shape that comprises a base formed in the shape of an N-gon (wherein N is an integer) with N triangular faces that rise from the base to converge at a point above the base. If the point where the N faces meet is positioned such that a line drawn from the point where the N faces meet to the center of the N-gon base is perpendicular to the N-gon base, the pyramid is referred to as a right pyramid. Pyramids can be further formed with circular or elliptical bases which are commonly referred to as cone or an elliptical pyramid respectively. A pyramid is defined with a base, an apex, and a lateral face. The base is the N-gon shaped base described above. The apex is the convergence point described above. The lateral face is formed from the N triangular faces described above.

Pyramidal Segment: As used in this disclosure, a pyramidal segment refers to a pyramid that is bifurcated by a single plane that is parallel to or contains the center axis of the prism or cylinder.

Radial: As used in this disclosure, the term radial refers to a direction that: 1) is perpendicular to an identified central axis; or, 2) projects away from a center point.

Relaxed Shape: As used in this disclosure, a structure is considered to be in its relaxed state when no shear, strain, or torsional forces are being applied to the structure.

Shell: As used in this disclosure, a shell is a structure that forms an outer covering intended to contain an object. Shells are often, but not necessarily, rigid or semi-rigid structures that are intended to protect the object contained within it.

Sleeve: As used in this disclosure, a sleeve is a tube-like covering that is placed over a rod, shaft or other cylindrical object.

Spring: As used in this disclosure, a spring is a device that is used to store mechanical energy. This mechanical energy will often be stored by: 1) deforming an elastomeric material that is used to make the device; 2) the application of a torque to a semi-rigid structure; or 3) a combination of the previous two items.

Tension Spring: As used in this disclosure, a tension spring, is an elastomeric structure that resists forces attempting to increase the span of the length of the elastomeric structure. The tension spring will return to its original position when the pulling force is removed.

Truncated: As used in this disclosure, a geometric object is truncated when an apex, vertex, or end is cut off by a line or plane.

Truncated Pyramid: As used in this disclosure, a truncated pyramid is a frustum that remains when the apex of a pyramid is truncated by a plane that is parallel to the base of the pyramid.

With respect to the above description, it is to be realized that the optimum dimensional relationship for the various components of the invention described above and in FIGS. 1 through 12 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. A handle for a handheld object comprising a PDD grip and a personal data device; wherein the PDD grip attaches to the personal data device; wherein the handle for a handheld object is a mechanical structure; wherein the handle for a handheld object is configured for use with the personal data device; wherein the handle for a handheld object is adapted to attach to a finger of a client; wherein the handle for a handheld object attaches the personal data device to the finger of the client; wherein the PDD grip comprises a proximal disk, a distal disk, a coupling structure, and a pivot; wherein the coupling structure attaches the proximal disk to the distal disk; wherein the pivot attaches the proximal disk to a PDD shell of the personal data device; wherein the proximal disk is further defined with an interior face and an exterior face; wherein the interior face is the face of the proximal disk that attaches to the PDD shell of the personal data device; wherein the exterior face is the face of the proximal disk that is distal from the interior face; wherein the proximal disk is a disk-shaped structure; wherein the proximal disk transfers the load of the personal data device and the PDD shell directly to the coupling structure; wherein the distal disk is a disk-shaped structure; and wherein the distal disk is geometrically identical to the proximal disk; wherein the coupling structure is a mechanical structure; wherein the coupling structure is an elastic structure; wherein the coupling structure is formed as a composite prism structure; wherein the coupling structure is adapted to receive the finger of the client; wherein the coupling structure comprises a first segment, a second segment, a third segment, and a fourth segment.

2. The handle for a handheld object according to claim 1 wherein the handle for a handheld object is a rotating structure.

3. The handle for a handheld object according to claim 2 wherein the personal data device further comprises PDD shell; wherein the PDD shell forms a protective casing that contains the personal data device.

4. The handle for a handheld object according to claim 3 wherein the PDD grip is the mechanical structure; wherein the PDD grip attaches to the PDD shell of the personal data device.

5. The handle for a handheld object according to claim 4 wherein the PDD grip is an elastic structure.

6. The handle for a handheld object according to claim 5 wherein the PDD grip is adapted to attach to a finger of the client such that the client can manipulate the personal data device without having to grasp the personal data device.

7. The handle for a handheld object according to claim 1, wherein the coupling structure attaches to the distal disk such that the distal disk is diametrically opposed to the proximal disk.

8. The handle for a handheld object according to claim 7 wherein the first segment attaches to the distal disk; wherein the second segment attaches to the distal disk; wherein the third segment attaches to the proximal disk; wherein the fourth segment attaches to the proximal disk; wherein the first segment attaches to the third segment; wherein the second segment attaches to the fourth segment.

9. The handle for a handheld object according to claim 8
wherein the first segment, the second segment, the third segment, and the fourth segment are elastic structures;
wherein the first segment, the second segment, the third segment, and the fourth segment bind the coupling structure to the finger of the client.

10. The handle for a handheld object according to claim 9
wherein the first segment is a mechanical structure;
wherein the second segment is a mechanical structure;
wherein the third segment is a mechanical structure;
wherein the fourth segment is a mechanical structure;
wherein the first segment is formed in the shape of a pyramidal segment of a first hypothetical truncated pyramid;
wherein the second segment is formed in the shape of a pyramidal segment of a first hypothetical truncated pyramid;
wherein the third segment is formed in the shape of a pyramidal segment of a second hypothetical truncated pyramid;
wherein the fourth segment is formed in the shape of a pyramidal segment of a second hypothetical truncated pyramid;
wherein the first hypothetical truncated pyramid is further defined with a first open truncated apex, a first open base, and a first lateral face;
wherein the second hypothetical truncated pyramid is further defined with a second open truncated apex, a second open base, and a second lateral face;
wherein the first hypothetical truncated pyramid and the second hypothetical truncated pyramid are identical;
wherein the first segment deforms under tension;
wherein the second segment deforms under tension;
wherein the third segment deforms under tension;
wherein the fourth segment deforms under tension.

11. The handle for a handheld object according to claim 10
wherein the first segment comprises a first apex, a first base, and a first lateral face;
wherein the first apex is the edge of the first lateral face that attaches to the distal disk;
wherein the first apex is the edge formed by the first open truncated apex of the first hypothetical truncated pyramid;
wherein the first base is the edge formed by the first open base of the first hypothetical truncated pyramid;
wherein the first base is the edge of the first lateral face that attaches to the third base of the third lateral face of the second hypothetical truncated pyramid;
wherein the first lateral face is a rectilinear structure;
wherein the first lateral face is an elastic structure;
wherein the first lateral face deforms under tension;
wherein the second segment comprises a second apex, a second base, and a second lateral face;
wherein the second apex is the edge of the second lateral face that attaches to the distal disk;
wherein the second apex is the edge formed by the first open truncated apex of the first hypothetical truncated pyramid;
wherein the second base is the edge formed by the first open base of the first hypothetical truncated pyramid;
wherein the second base is the edge of the second lateral face that attaches to the fourth base of the fourth lateral face of the second hypothetical truncated pyramid;
wherein the second lateral face is a rectilinear structure;
wherein the second lateral face is an elastic structure;
wherein the second lateral face deforms under tension;
wherein the third segment comprises a third apex, a third base, and a third lateral face;
wherein the third apex is the edge of the third lateral face that attaches to the exterior face of the proximal disk;
wherein the third base is the edge formed by the second open base of the second hypothetical truncated pyramid;
wherein the third apex is the edge formed by the second open truncated apex of the second hypothetical truncated pyramid;
wherein the third base is the edge of the third lateral face that attaches to the first base of the first lateral face of the first hypothetical truncated pyramid;
wherein the third lateral face is a rectilinear structure;
wherein the third lateral face is an elastic structure;
wherein the third lateral face deforms under tension;
wherein the fourth segment comprises a fourth apex, a fourth base, and a fourth lateral face;
wherein the fourth apex is the edge of the fourth lateral face that attaches to the exterior face of the proximal disk;
wherein the fourth apex is the edge formed by the second open truncated apex of the second hypothetical truncated pyramid;
wherein the fourth base is the edge formed by the second open base of the second hypothetical truncated pyramid;
wherein the fourth base is the edge of the fourth lateral face that attaches to the second base of the second lateral face of the first hypothetical truncated pyramid;
wherein the fourth lateral face is a rectilinear structure;
wherein the fourth lateral face is an elastic structure;
wherein the fourth lateral face deforms under tension.

12. The handle for a handheld object according to claim 11
wherein the second segment is identical to the first segment;
wherein the fourth segment is identical to the third segment;
wherein the center axes of the first segment and the second segment are aligned with the center axis of the first hypothetical truncated pyramid;
wherein the center axes of the third segment and the fourth segment are aligned with the center axis of the second hypothetical truncated pyramid;
wherein the alignment of the proximal disk, the distal disk, the coupling structure, and the pivot are such that the PDD grip forms a composite prism structure.

13. The handle for a handheld object according to claim 12
wherein the first segment, the second segment, the third segment and the fourth segment combine to form the coupling structure;
wherein the first segment, the second segment, the third segment, and the fourth segment are assembled such that the first open base of the first hypothetical truncated pyramid attaches to the second open base of the second hypothetical truncated pyramid to form the composite prism structure of the coupling structure.

14. The handle for a handheld object according to claim 13
wherein the first segment, the second segment, the third segment, and the fourth segment are aligned such that a finger channel is formed in the coupling structure;

wherein the finger channel is a radial opening formed through the center axis of the composite prism structure of the coupling structure;

wherein the finger channel is sized such that when the finger of the client inserts into the finger channel, the coupling structure deforms as described elsewhere in this disclosure.

15. The handle for a handheld object according to claim 14 wherein the pivot is a shaft that attaches the proximal disk to the PDD shell of the personal data device;

wherein the pivot attaches the proximal disk to the PDD shell such that the PDD grip rotates relative to the PDD shell.

16. The handle for a handheld object according to claim 15 wherein the proximal disk is an octagonal-shaped disk structure;

wherein the distal disk is an octagonal-shaped disk structure.

* * * * *